(12) United States Patent
Koo

(10) Patent No.: US 6,368,909 B2
(45) Date of Patent: *Apr. 9, 2002

(54) METHODS OF FABRICATING INTEGRATED CIRCUIT FERROELECTRIC CAPACITORS INCLUDING TENSILE STRESS APPLYING LAYERS ON THE UPPER ELECTRODE THEREOF

(75) Inventor: Bon-Jae Koo, Kyunggi-do (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/281,706

(22) Filed: Mar. 30, 1999

(30) Foreign Application Priority Data

Mar. 30, 1998 (KR) .............................................. 98-10989

(51) Int. Cl.⁷ .......................................... H01L 21/8242
(52) U.S. Cl. ............................ 438/240; 438/3; 438/763
(58) Field of Search ............................ 438/3, 240, 253, 438/396, 762, 763, 788, 789

(56) References Cited

U.S. PATENT DOCUMENTS

| | | | | |
|---|---|---|---|---|
| 4,962,063 A | * | 10/1990 | Maydan et al. .............. | 438/788 |
| 5,374,578 A | * | 12/1994 | Patel et al. ...................... | 438/3 |
| 5,401,680 A | * | 3/1995 | Abt et al. ........................ | 438/3 |
| 5,438,023 A | * | 8/1995 | Argos, Jr. et al. ............... | 438/3 |
| 5,626,679 A | * | 5/1997 | Shimizu et al. ....... | 118/723 MR |
| 5,661,334 A | | 8/1997 | Akram ......................... | 257/632 |
| 5,665,635 A | | 9/1997 | Kwon et al. ................. | 438/427 |
| 5,679,606 A | | 10/1997 | Wang et al. ................. | 437/195 |
| 5,702,980 A | | 12/1997 | Yu et al. ....................... | 438/187 |

OTHER PUBLICATIONS

Wolf et al., "Silicon Processing for the VLSI Era, vol. 1–Process Technology", Lattice Press, 1987, pp. 182–185.

* cited by examiner

Primary Examiner—Chandra Chaudhari
(74) Attorney, Agent, or Firm—Myers Bigel Sibley & Sajovec

(57) ABSTRACT

An integrated circuit ferroelectric capacitor is fabricated by forming on an integrated circuit substrate, a lower electrode adjacent the substrate, an upper electrode remote from the substrate and a ferroelectric layer therebetween, and forming a first low temperature oxide layer on the upper electrode, opposite the ferroelectric layer. The low temperature oxide may be annealed in oxygen. A second low temperature oxide layer may be formed on the first low temperature oxide layer, opposite the upper electrode, and the second low temperature oxide layer may be annealed in oxygen. The first and second low temperature oxide layers preferably comprise at least one of Plasma Enhanced Tetraethoxysilane (PE-TEOS), undoped silicon glass (USG) and Electron Cyclotron Resonance oxide (ECR-OX). An electrical contact to the lower electrode may be formed between the steps of forming a first low temperature oxide layer and a second low temperature oxide layer. The low temperature oxide layers act as dielectric layers that apply tensile stress to the ferroelectric layer.

6 Claims, 7 Drawing Sheets

METHODS OF FABRICATING INTEGRATED CIRCUIT FERROELECTRIC CAPACITORS INCLUDING TENSILE STRESS APPLYING LAYERS ON THE UPPER ELECTRODE THEREOF

FIELD OF THE INVENTION

This invention relates to integrated circuit devices and fabrication methods therefor, and more particularly to integrated circuit ferroelectric capacitors and methods of fabricating same.

BACKGROUND OF THE INVENTION

Integrated circuit capacitors are widely used in integrated circuits, such as Random Access Memory (RAM) devices including Dynamic Random Access Memory (DRAM) devices. For example, in a single transistor DRAM memory cell, the charge stored in a memory cell capacitor is selectively coupled to a memory bit line through the source/drain path of an access transistor. The gate electrode of the access transistor is coupled to a word line. This charge is sensed in order to determine the state of the memory cell. Since the charge on the capacitor tends to dissipate, DRAM cells are refreshed periodically in order to preserve the data contents thereof.

Ferroelectric materials have been used as the dielectric in a memory cell capacitor. Ferroelectric materials can exhibit a high dielectric constant. Moreover, RAM devices that use ferroelectric capacitors for memory cells, often referred to as Ferroelectric RAMs or FRAMs, also can be non-volatile because the ferroelectric material has two stable polarization states that can be defined by a hysteresis loop of polarization versus applied voltage. By measuring the charge which flows when a voltage is applied to a ferroelectric capacitor, the polarization state of the ferroelectric material can be determined. One polarization state is assigned a logic level "zero" and the other polarization state is assigned a logic level "one". Thus, ferroelectric capacitors can be used to store binary data in a RAM without the need to refresh the data.

FIG. 1 is a conventional hysteresis loop describing polarization charges (P:$\mu$C/cm$^2$) in a ferroelectric capacitor as a function of voltage (V) across the ferroelectric capacitor. It should be noted that when the voltage across the ferroelectric capacitor is zero, the ferroelectric capacitor can be in either of two polarization states, a logic "one" polarization state or a logic "zero" polarization state.

In FIG. 1, when the voltage across the capacitor is zero, the ferroelectric capacitor is, for example, at logic "zero" polarization state, for example "-Qr" as indicated by "D". When the voltage across the ferroelectric capacitor increases, toward the +V direction, the polarization charge (-Qr) increases toward the +P direction. As a result, if the voltage across the ferroelectric capacitor increases up to the voltage "+Vs", the polarization charge reaches a saturation state of maximum value "+Qs" as indicated at "A". After the polarization charge reaches the saturation state "A", even though the voltage decreases toward zero, the polarization charge does not drop to zero but stays at the "B" stage of remnant polarization state "+Qr", i.e., a logic "one" polarization state. On the other hand, when the voltage across the ferroelectric capacitor decreases from zero in the -V direction, i.e., opposite the initial direction, the polarization charge decreases in the -P direction from "+Qr". As a result, if the voltage decreases to "-Vs", the polarization charge reaches the saturation state "C" of minimum value "-Qs".

After the polarization charge reaches the saturation state "C", even though the voltage increases toward zero, the polarization charge does not drop to zero but stays at the "D" stage of remnant polarization state "-Qr", i.e., logic "one" polarization state.

Thus, when a positive or negative voltage is applied across the ferroelectric capacitor and removed, a remnant polarization "-Qr" or "+Qr" will be present in the ferroelectric material. Subsequently, when a voltage pulse of opposite polarity is applied across the capacitor, the remnant polarization is reversed. It is thus possible to switch repeatedly between two stable polarization states by means of voltage pulses. The design and operation of FRAM devices are well known to those having skill in the art and need not be described further herein.

In fabricating integrated circuit ferroelectric capacitors, it is desirable that the fabrication steps for the integrated circuit that are performed after fabricating the ferroelectric capacitors not degrade the ferroelectric characteristics of the ferroelectric material. As is well known to those having skill in the art, a conventional ferroelectric memory generally is fabricated by first fabricating a field effect transistor in an integrated circuit substrate. The field effect transistor includes an insulated gate electrode between spaced apart source/drain regions in the integrated circuit substrate. An interlayer dielectric layer is then formed on the integrated circuit substrate including on the field effect transistor. A lower electrode, a ferroelectric layer and an upper electrode are then formed on the interlayer dielectric layer. Contact holes are opened in the interlayer dielectric layer to expose a source/drain region, the lower electrode and the upper electrode. A conductive layer is then deposited in the contact holes and on the interlayer dielectric layer to form a conductive interconnection.

In order to exhibit the ferroelectric hysteresis loop of FIG. 1, the ferroelectric material generally must retain its perovskite structure. Unfortunately, during the integrated circuit fabrication process steps after fabricating the ferroelectric capacitor, compression stresses and/or hydrogen may be produced which can affect the ferroelectric material structure, thereby reducing the remnant polarization. These deleterious effects may be produced when forming a dielectric layer on the ferroelectric capacitor.

SUMMARY OF THE INVENTION

It is therefore an object of the present invention to provide improved integrated circuit ferroelectric capacitors and methods of fabricating the same.

It is another object of the present invention to provide ferroelectric capacitors and fabrication methods that can reduce deleterious effects on the ferroelectric material during subsequent fabrication steps.

These and other objects are provided, according to the present invention, by fabricating an integrated circuit ferroelectric capacitor by forming on an integrated circuit substrate, a lower electrode adjacent the substrate, an upper electrode remote from the substrate and a ferroelectric layer therebetween, and forming a first low temperature oxide layer on the upper electrode, opposite the ferroelectric layer. The low temperature oxide may be annealed in oxygen. A second low temperature oxide layer may be formed on the first low temperature oxide layer, opposite the upper electrode, and the second low temperature oxide layer may be annealed in oxygen. The first and second low temperature oxide layers preferably comprise at least one of Plasma Enhanced Tetraethoxysilane (PE-TEOS), Undoped Silicon Glass (USG) and Electron Cyclotron Resonance Oxide (ECR-OX). An electrical contact to the lower electrode may be formed between the steps of forming a first low temperature oxide layer and a second low temperature oxide layer.

The low temperature oxide layers act as dielectric layers that apply tensile stress to the ferroelectric layer. This contrasts from conventional dielectric layers that generally are formed on integrated circuit capacitors. These conventional dielectric layers may apply compressive stress to the ferroelectric layer and thereby reduce the remnant polarization thereof.

Integrated circuit capacitors according to the present invention comprise a lower electrode on an integrated circuit substrate, a ferroelectric layer on the lower electrode, and an upper electrode on the ferroelectric layer such that the lower electrode is adjacent the substrate, the upper electrode is remote from the substrate and the ferroelectric layer is therebetween. A first layer comprising low temperature oxide is provided on the upper electrode, opposite the ferroelectric layer. A second layer comprising low temperature oxide may be provided on the first low temperature oxide, opposite the upper electrode. An electrical contact to the lower electrode may be provided on the first layer comprising low temperature oxide such that the second layer comprising low temperature oxide is on the first layer comprising low temperature oxide and on the electrical contact. As described, the first and second layers comprising low temperature oxide preferably are first and second dielectric layers that apply tensile stress to the ferroelectric layer. The first and second layers comprising low temperature oxide preferably comprise at least one of PE-TEOS, USG, and ECR-OX.

DETAILED DESCRIPTION OF PREFERRED EMBODIMENTS

Figure 1:
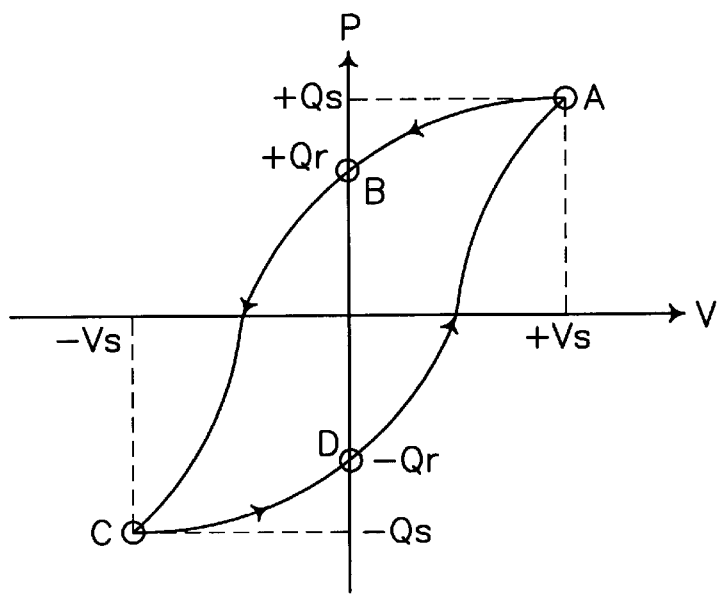
FIG. 1 is a hysteresis loop illustrating the polarization charge P in a ferroelectric capacitor as a function of the voltage V across the ferroelectric capacitor.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2A:
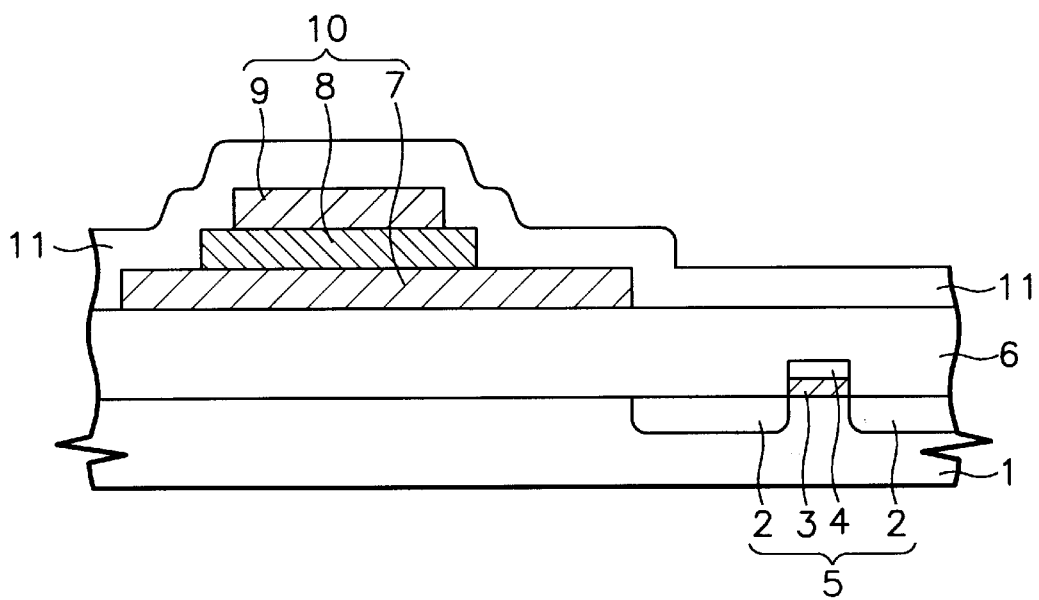
FIGS. 2A–2D are cross-sectional views of integrated circuit ferroelectric capacitors according to the present invention during intermediate fabrication steps.

FIGS. 2A–2D are cross-sectional views illustrating integrated circuit ferroelectric capacitors according to the present invention during intermediate fabrication steps. As shown in FIG. 2A, an integrated circuit substrate such as a silicon semiconductor substrate 1 includes a field effect transistor 5 having spaced apart source/drain regions 2, a gate insulating layer 3 and a gate electrode 4. The fabrication of the field effect transistor 5 is well known to those having skill in the art and need not be described further herein. A first interlayer dielectric layer 6 is provided on the integrated circuit substrate 1 including on the field effect transistor 5. An integrated circuit ferroelectric capacitor 10 includes a lower electrode 7 for example comprising platinum, adjacent the substrate 1, an upper electrode 9 for example comprising platinum, remote from the substrate 1, and a ferroelectric layer 8 for example comprising Barium Strontium Titanate (BST) therebetween. The upper and lower electrodes and the ferroelectric layer may be patterned using conventional techniques such as dry etching. The fabrication of the ferroelectric capacitor 10 is well known to those having skill in the art and need not be described further herein.

Still referring to FIG. 2A, a second interlayer dielectric layer 11 is formed on the first interlayer dielectric layer 6 and on the ferroelectric capacitor 10. According to the invention, the second interlayer dielectric layer 11 preferably comprises a low temperature oxide such as a PE-TEOS, USG and/or ECR-OX layer which exhibits a tensile stress relative to the ferroelectric capacitor 10. The ferroelectric capacitor characteristics such as remnant polarization may thereby be improved.

For example, an ECR-OX layer can be deposited at a temperature of about 200° C. and with RF power of about 400 W using $N_2O$, $SiH_4$, and $O_2$ gases. The ECR technique may be advantageous because it can supply a high plasma energy at low temperature. A PE-TEOS layer can be formed by a plasma CVD technique using TEOS and $N_2O$ at a temperature of about 400° C. and with RF power of about 400 W. A USG layer can be formed by APCVD using $O_3$-TEOS at a temperature of about 400° C.

Low temperature oxides are generally described at Pages 182–185 of Wolf et al., "Silicon Processing for the VLSI Era, Volume 1—Process Technology", Lattice Press, 1987. PE-TEOS is described, for example, in U.S. Pat. No. 5,702,980. USG is described, for example, in U.S. Pat. No. 5,665,635. ECR-OX is described, for example, in U.S. Pat. No. 5,679,606. The disclosures of all of these references are hereby incorporated herein by reference. The structure and fabrication of low temperature oxides including PE-TEOS, USG and ECR-OX are well known to those having skill in the art and need not be described further herein.

Figure 3A:
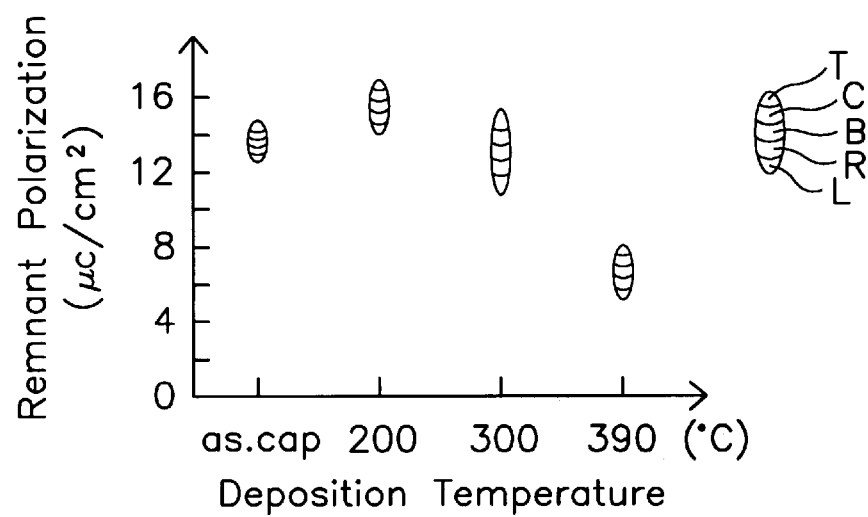
FIG. 3A graphically illustrates a relationship between remnant polarization and deposition temperature of a low temperature oxide layer.
Figure 3B:
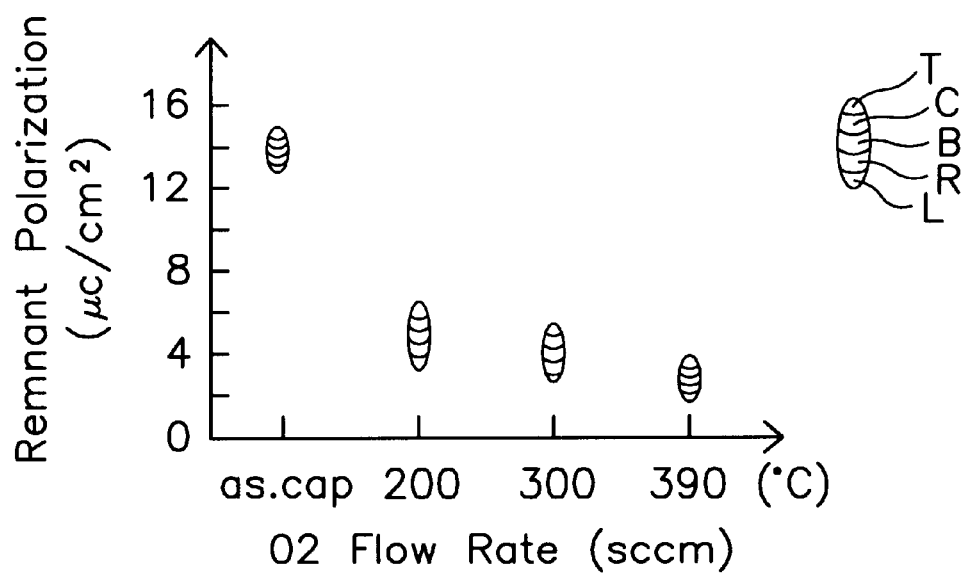
FIG. 3B graphically illustrates a relationship between remnant polarization and oxygen flow rate during deposition of a low temperature oxide layer.
Figure 4A:
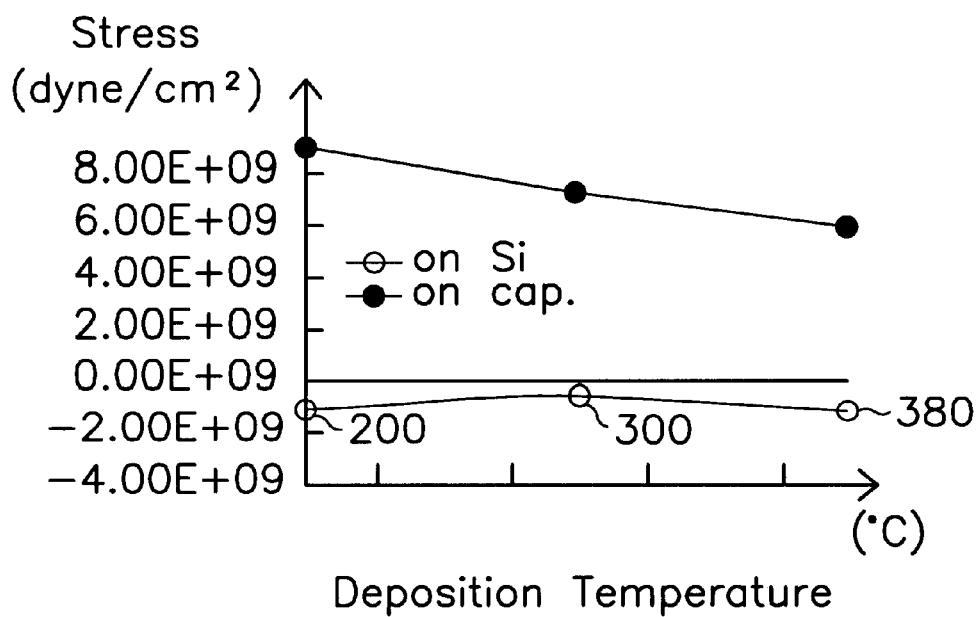
FIG. 4A graphically illustrates a relationship between stress and deposition temperature of ECR-OX.
Figure 4B:
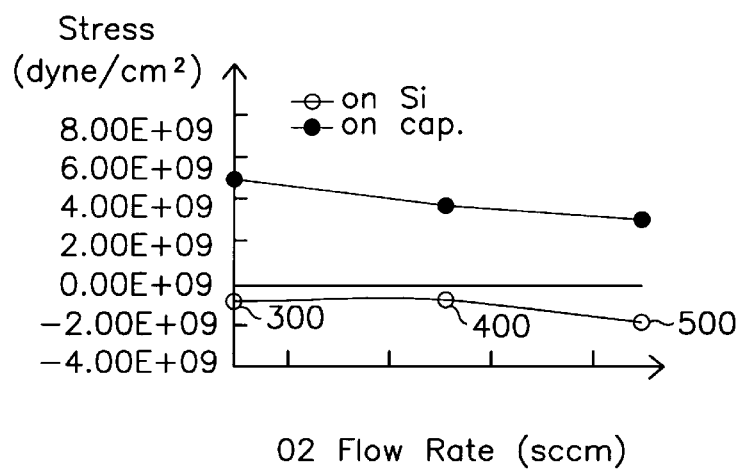
FIG. 4B graphically illustrates a relationship between stress and oxygen flow rate of ECR-OX.

FIG. 3A and FIG. 3B respectively show the remnant polarization of the capacitor 10 as a function of the deposition temperature and $O_2$ flow rate of an ECR-OX layer. In FIG. 3A and FIG. 3B, "as.cap" means that the capacitor is not covered with an ECR-OX layer. As illustrated in FIG. 3A and FIG. 3B, the remnant polarization ($\mu C/cm^2$) decreases with an increase of the deposition temperature and $O_2$ flow rate of the ECR-OX layer. On the other hand, FIG. 4A shows the relationship between the stress and deposition temperature of ECR-OX and FIG. 4B shows the relationship between the stress and oxygen flow rate of ECROX. As illustrated in FIG. 4A and FIG. 4B, the tensile stress of the ECR-OX layer decreases gradually with an increase of deposition temperature and $O_2$ flow rate of the ECR-OX layer. Therefore, it may be preferable to deposit the ECR-OX layer at a temperature of about 200° C. at which temperature the ferroelectric capacitor has a high remnant polarization and the ECR-OX layer has a high tensile stress with respect to the capacitor.

Figure 2B:
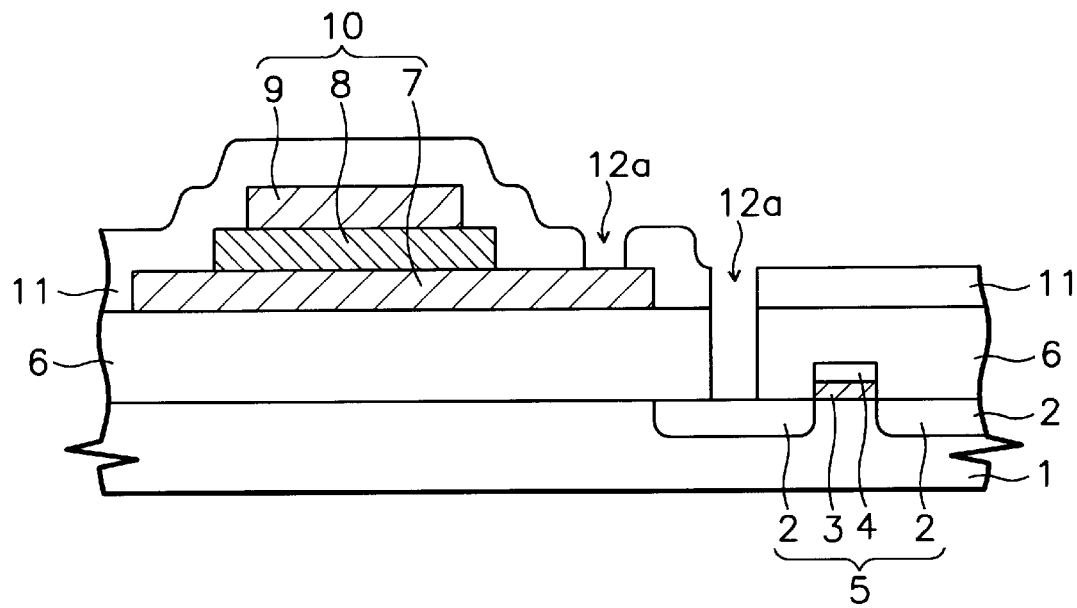

Referring now to FIG. 2B, contact holes 12a are opened in the interlayer dielectric layer to expose the lower electrode 7 and the source/drain region 2, for example by dry etching. To remove the plasma damage in the contact holes 12a, a first anneal is performed in an oxygen atmosphere at less than about 450° C.

Figure 2C:
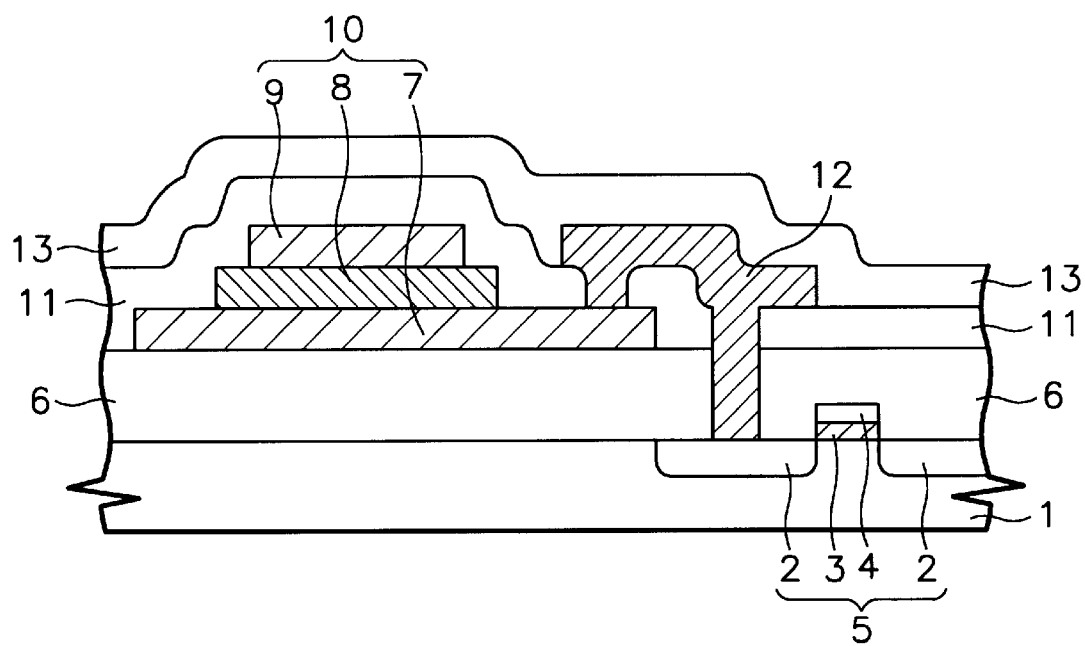

Referring to FIG. 2C, a conductive layer such as a first metal layer is deposited in the contact holes 12a and over the second interlayer insulating layer 11, and patterned, for example by dry etching, to form a first metal interconnection 12. Then, a third interlayer dielectric layer 13 is formed on the second interlayer dielectric layer 11 and on the metal interconnection 12. The third interlayer dielectric layer 13 also comprises a low temperature oxide layer such as PE-TEOS, USG, or ECR-OX which exhibits a tensile stress with respect to the ferroelectric capacitor 10 and thereby can improve the capacitor characteristics such as remnant polarization.

Figure 2D:
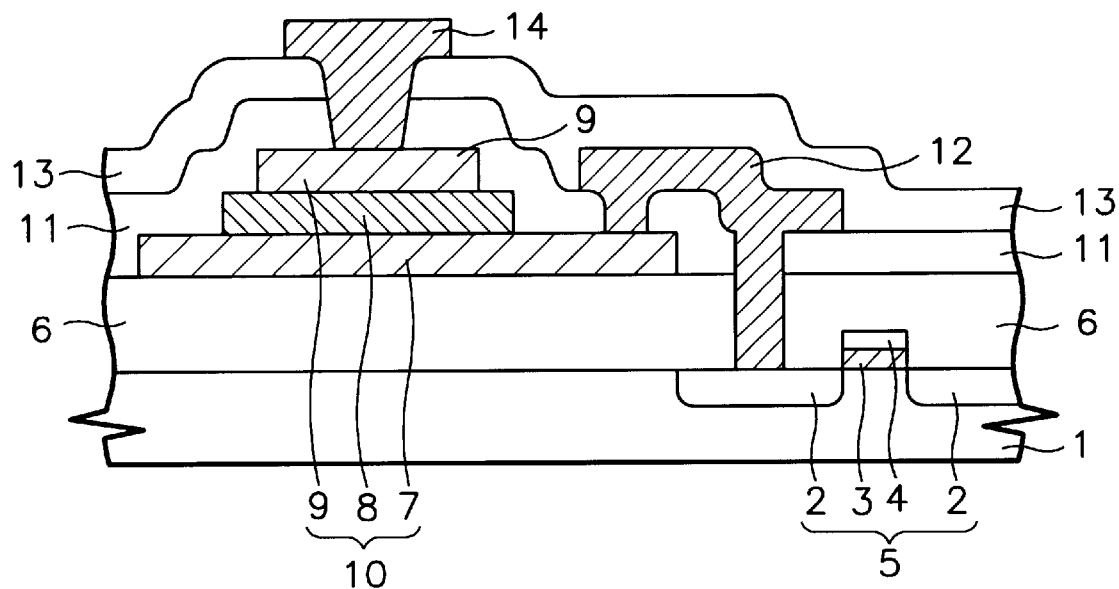

Referring to FIG. 2D, a second contact hole is opened in the third interlayer dielectric layer 13 to expose the upper electrode 9, for example by dry etching. Then, a second anneal may be performed in an oxygen atmosphere at less than about 450° C. A second metal layer is deposited in the contact hole and over the third interlayer dielectric layer 13, and patterned, for example by dry etching, to form a second metal interconnection 14.

Figure 5:
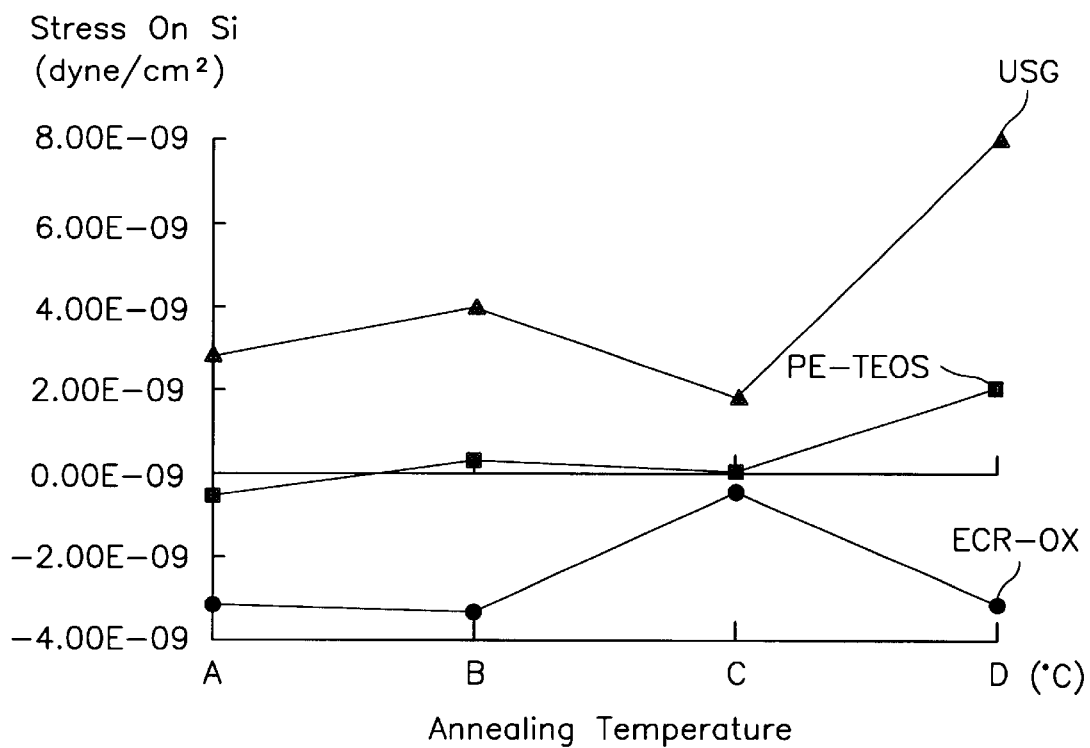
FIG. 5 graphically illustrates stresses of various interlayer dielectric layers that are applied to an integrated circuit substrate as a function of temperature after a low temperature oxide layer is formed on the substrate.

It may be preferable that the stress of the oxide layer applied to the ferroelectric capacitor have a constant value throughout the annealing process after deposition, because the characteristics of the ferroelectric capacitor may degrade in proportion to the stress variation of the overlying oxide layer. FIG. 5 shows stress of various low temperature oxide layers applied to the substrate as a function of annealing temperature after the low temperature oxide layer is deposited on the substrate. In FIG. 5, "A" indicates the stress applied to the substrate right after deposition of low temperature oxide layer, "D" indicates the stress applied to the substrate when annealing is performed at a temperature of about 450° C., "B" indicates cooling down the temperature to the "A" state after annealing at about 450° C., and "C" indicates the stress difference between "A" and "B". As shown in FIG. 5, the ECR-OX layer has a relatively low stress variation during the annealing process after deposition in comparison to the other low temperature oxide layers, USG layer and PE-TEOS.

Figure 6A:
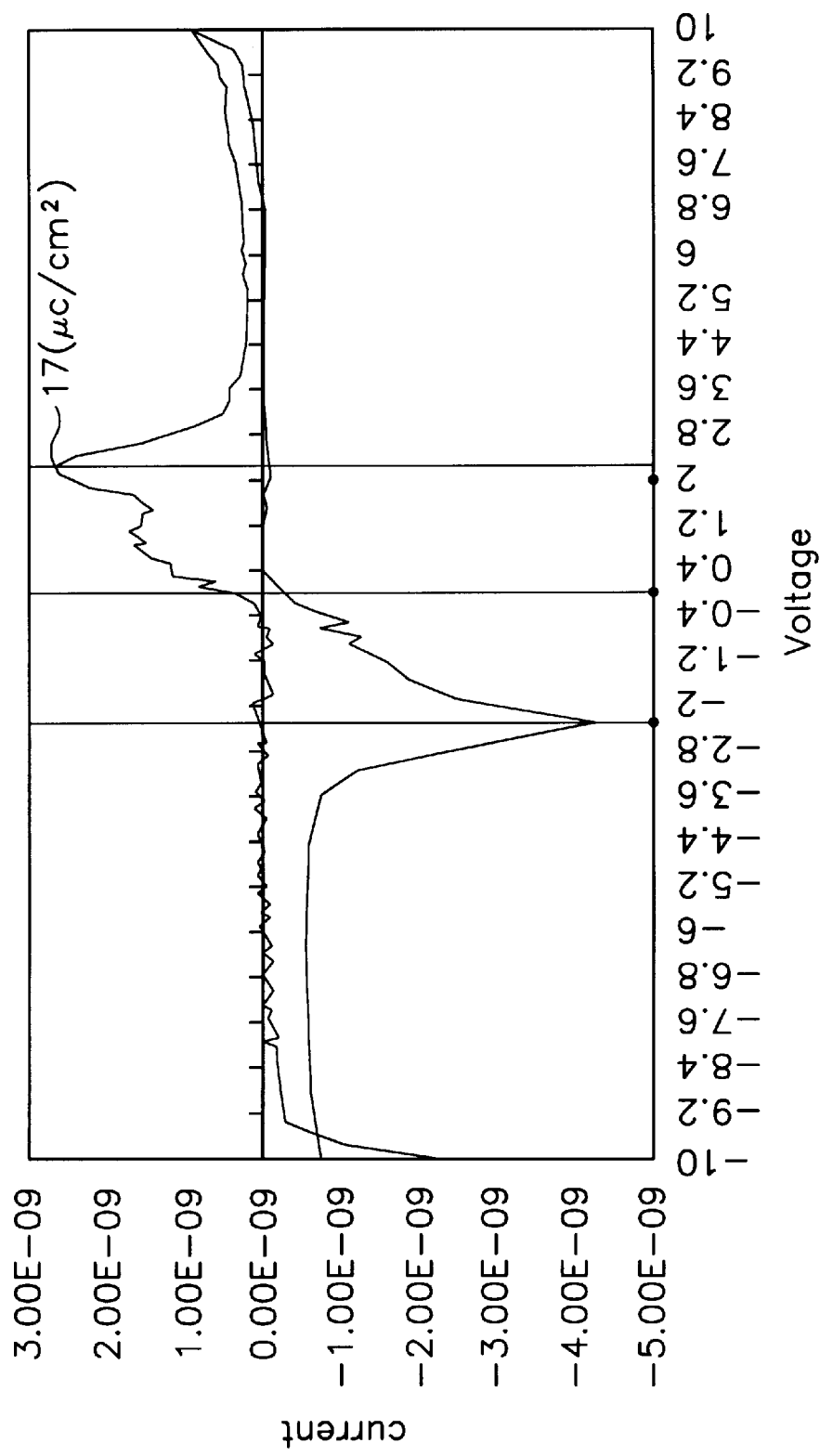
FIG. 6A graphically illustrates current and remnant polarization as a function of applied voltage when 2000 Å thick ECR-OX and 2500 Å thick USG layers are respectively used as a second interlayer dielectric layer and third interlayer dielectric layer according to the present invention.
Figure 6B:
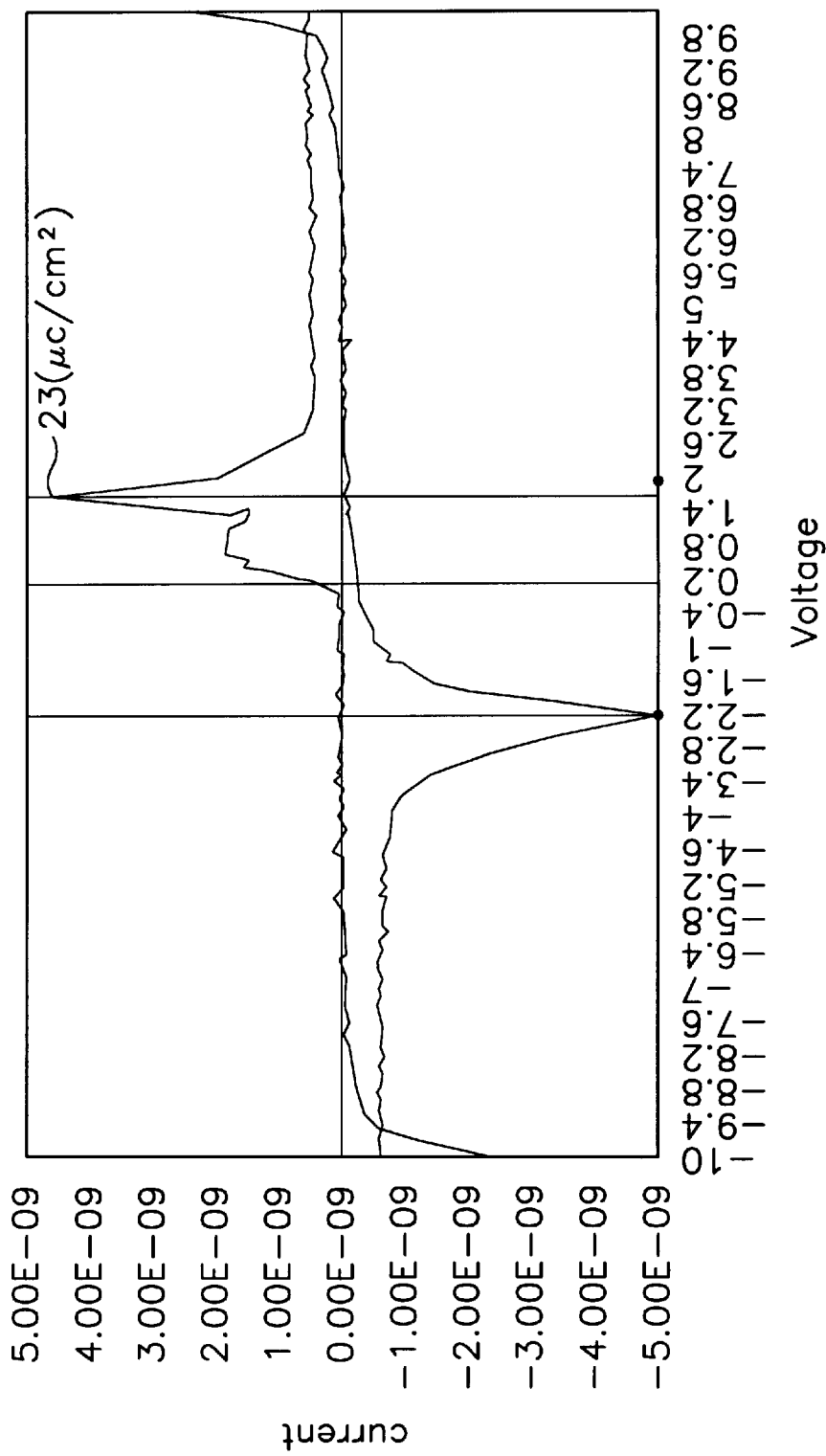
FIG. 6B graphically illustrates current and remnant polarization as a function of applied voltage when 4500 Å thick ECR-OX layer is used as a second interlayer dielectric layer and a third interlayer dielectric layer according to the present invention.

FIG. 6A shows current and remnant polarization as a function of applied voltage when a 2000 Å thick ECR-OX layer and a 2500 Å thick USG layer are respectively used as a second interlayer dielectric layer and third interlayer dielectric layer according to the present invention. FIG. 6B shows current and remnant polarization as a function of applied voltage when a 4500 Å thick ECR-OX layer is used as a second interlayer dielectric layer and a third interlayer dielectric layer according to the present invention.

Comparing FIG. 6A with FIG. 6B, FIG. 6B, wherein the ECR-OX layer provides second and third interlayer dielectric layers, has a relatively low supply voltage and a relatively high remnant polarization. This is because, as described previously, the USG generally is deposited at about 400° C. and has a relatively high stress variation as shown in FIG. 5. From FIG. 5 and FIG. 6, it is desirable that the third insulating layer is formed of low temperature oxide layer so as to improve the ferroelectric capacitor characteristics. Accordingly, a low temperature oxide layer such as ECR-OX, USG, and/or PE-TEOS is deposited over the ferroelectric capacitor to have a tensile stress and thereby to improve the ferroelectric characteristics.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for fabricating an integrated circuit device comprising the steps of:

forming an integrated circuit having a region in an integrated circuit substrate;

forming a first interlayer dielectric layer on said integrated circuit substrate;

forming a ferroelectric capacitor on said first interlayer dielectric layer, said ferroelectric capacitor having a lower electrode, a ferroelectric film, and an upper electrode;

forming a second interlayer dielectric layer on said ferroelectric capacitor and said first interlayer dielectric layer;

forming a plurality of first contact holes that penetrate said first and second interlayer dielectric layers, a first of the plurality of first contact holes exposing said lower electrode and a second of the plurality of first contact holes exposing said region;

performing a first annealing in oxygen;

forming a first metal interconnection on said second interlayer dielectric layer and on said plurality of first contact holes and electrically connecting said lower electrode to said region;

forming a third interlayer dielectric layer on said first metal interconnection and said second interlayer dielectric layer;

forming a second contact hole that penetrates said third and second interlayer dielectric layers, said second contact hole exposing said upper electrode;

performing a second annealing in oxygen so that said second and third interlayer dielectric layers have a tensile stress with respect to said ferroelectric capacitor; and forming a second metal interconnection on the third interlayer dielectric layer and on said second contact hole and being electrically connected to said upper electrode.

2. A method according to claim 1 further comprising the steps of:

forming a first layer at about 200° C. that applies tensile stress to the ferroelectric layer, opposite the ferroelectric layer; and forming a second layer that applies tensile stress to the ferroelectric layer on the first layer, opposite the upper electrode.

3. A method according to claim 2 wherein the following step is performed between the steps of forming a first layer and forming a second layer:

forming an electrical contact to the lower electrode, on the first layer; and wherein the step of forming a second layer comprises the step of forming a second layer that applies tensile stress to the ferroelectric layer on the first layer and on the electrical contact, opposite the upper electrode.

4. A method according to claim 2 wherein the first and second layers are first and second dielectric layers that apply tensile stress to the ferroelectric layer.

5. A method according to claim 1, wherein the step of forming a second interlayer dielectric layer comprises forming an ECR-OX layer on the upper electrode at an RF power of about 400 W.

6. A method according to claim 1 wherein the step of forming a second interlayer dielectric layer comprises forming an ECR-OX layer directly on the upper electrode.

* * * * *